(12) United States Patent
Moor et al.

(10) Patent No.: US 11,402,451 B2
(45) Date of Patent: Aug. 2, 2022

(54) TIMING SIGNAL DISTRIBUTION TO PET IMAGING COMPONENTS VIA OPTICAL PATH

(71) Applicant: Siemens Medical Solutions USA, Inc., Malvern, PA (US)

(72) Inventors: Andrew Philip Moor, Knoxville, TN (US); Nan Zhang, Knoxville, TN (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 128 days.

(21) Appl. No.: 16/948,590

(22) Filed: Sep. 24, 2020

(65) Prior Publication Data

US 2022/0091287 A1    Mar. 24, 2022

(51) Int. Cl.
*G01R 33/48* (2006.01)
*G01R 33/422* (2006.01)
*G01T 1/29* (2006.01)

(52) U.S. Cl.
CPC ......... *G01R 33/481* (2013.01); *G01R 33/422* (2013.01); *G01T 1/2985* (2013.01)

(58) Field of Classification Search
CPC .... G01T 1/2985; G01R 33/422; G01R 33/481
See application file for complete search history.

(56) References Cited

U.S. PATENT DOCUMENTS

| | | | |
|---|---|---|---|
| 9,322,940 B2 | 4/2016 | Weissler et al. | |
| 2006/0293580 A1* | 12/2006 | Ladebeck | G01R 33/422 600/407 |
| 2007/0102641 A1* | 5/2007 | Schmand | G01R 33/381 250/363.04 |
| 2008/0200796 A1* | 8/2008 | Graham | G01R 33/28 345/173 |
| 2008/0265887 A1* | 10/2008 | Linz | G01R 33/28 324/318 |
| 2009/0012387 A1* | 1/2009 | Hanson | A61B 5/0013 324/307 |
| 2010/0188082 A1* | 7/2010 | Morich | G01R 33/481 250/363.04 |
| 2012/0223715 A1* | 9/2012 | Park | A61B 6/037 324/318 |

(Continued)

OTHER PUBLICATIONS

"LMK05318 Ultra-Low Jitter Network Synchronizer Clock With Two Frequency Domains", Texas Instruments, SNAS771—Dec. 2018, 86 pages.

*Primary Examiner* — Dixomara Vargas

(57) ABSTRACT

Systems and methods include generation of a source optical signal outside of a radiofrequency-shielded cabin based on a reference electrical clock signal, transmission of the source optical signal into the radiofrequency-shielded cabin via optical media, generation of an electrical clock signal based on the source optical signal within the radiofrequency-shielded cabin, jitter cleaning of the electrical clock signal within the radiofrequency-shielded cabin to generate a jitter-cleaned electrical clock signal based on an average frequency of the electrical clock signal and a jitter of a magnetically-compatible jitter cleaner oscillator, and transmission of the jitter-cleaned electrical clock signal to a plurality of positron emission tomography scanner detectors disposed within the radiofrequency-shielded cabin.

18 Claims, 9 Drawing Sheets

(56) References Cited

U.S. PATENT DOCUMENTS

| | | | | |
|---|---|---|---|---|
| 2013/0234710 A1* | 9/2013 | Kanno | ............... | A61B 5/0035 |
| | | | | 324/318 |
| 2015/0014545 A1* | 1/2015 | Weissler | ............... | G01T 1/20 |
| | | | | 250/336.1 |
| 2015/0045653 A1* | 2/2015 | Okamoto | ............. | G01R 33/307 |
| | | | | 600/411 |
| 2016/0103194 A1* | 4/2016 | Schulz | ............... | G01R 33/481 |
| | | | | 324/309 |
| 2016/0116598 A1* | 4/2016 | Wu | ............... | G01S 19/235 |
| | | | | 342/357.62 |
| 2018/0028092 A1* | 2/2018 | Okamoto | ............. | G01R 33/385 |
| 2018/0074144 A1* | 3/2018 | Dezorayev | ............ | G01T 1/2985 |
| 2019/0046034 A1* | 2/2019 | Hawkes | ............... | A61B 5/0026 |
| 2020/0011948 A1* | 1/2020 | Berneking | ............ | G01R 33/422 |
| 2020/0408862 A1* | 12/2020 | Reykowski | ........ | G01R 33/3692 |

\* cited by examiner

TIMING SIGNAL DISTRIBUTION TO PET IMAGING COMPONENTS VIA OPTICAL PATH

BACKGROUND

According to conventional positron-emission-tomography (PET) imaging, a radiopharmaceutical tracer is introduced into a patient body via arterial injection. Radioactive decay of the tracer generates positrons which eventually encounter electrons and are annihilated thereby. The annihilation produces two photons which travel in approximately opposite directions.

A ring of detectors surrounding the body detects the emitted photons, identifies "coincidences", and reconstructs PET images based on the identified coincidences. A coincidence is identified when two detectors disposed on opposite sides of the body detect the arrival of two photons within a particular coincidence time window. Because the two "coincident" photons travel in approximately opposite directions, the locations of the two detectors determine a Line-of-Response (LOR) along which an annihilation event may have occurred. In time-of-flight (TOF) systems, differences in the arrival times of two coincident photons at the detectors indicate a position along the LOR at which the annihilation event may have occurred.

The foregoing process requires extreme accuracy in the determination of the arrival times of photons. Typically, a clock signal is distributed to all detection units (e.g., detector electronics assemblies (DEAs)) within a PET system from a common point so that all arrival times are determined based on a single oscillator. A sync signal is similarly provided to ensure that all DEAs are running off the same clock signal and share a same "0" point in time.

Clock and sync signals have traditionally been distributed to PET imaging components through galvanic connection (e.g., coaxial or twisted-pair). In the case of PET/Magnetic Resonance (MR) hybrid imaging systems, the PET imaging components are located within an MR Radio Frequency (RF) cabin. Distribution of timing signals to these PET imaging components via galvanic connections requires extensive shielding and filtering at the boundary of the MR RF cabin to prevent disturbance of the MR imaging spectrum and RF noise floor and is therefore not preferred. Optical connections have been contemplated but current designs introduce jitter which renders thusly-distributed timing signals inadequately precise for TOF PET imaging.

Systems are desired to efficiently provide high-precision timing signals to PET imaging components disposed within an MR RF cabin via one or more optical paths.

DETAILED DESCRIPTION

The following description is provided to enable any person in the art to make and use the described embodiments and sets forth the best mode contemplated for carrying out the described embodiments. Various modifications, however, will remain apparent to those in the art.

Some embodiments facilitate the use of one or more optical paths to distribute timing signals to PET imaging components located in harsh magnetic environments such as an RF cabin of an MR system. Advantageously, optical media of the optical path(s) may pass through an RF boundary of an RF cabin via a relatively simple and inexpensive waveguide installed at the RF boundary. By eliminating galvanic connections, the requirement for precise filtering and management of a galvanic interface at the RF boundary is also eliminated, leading to cost savings, ease of assembly and installation, and removal of potential RF interference sources affecting the MR system noise floor. Embodiments may employ dedicated optical paths for clock and/or sync signals, enabling usage of lower-precision optical path components than would be required for non-dedicated optical paths.

Figure 1:
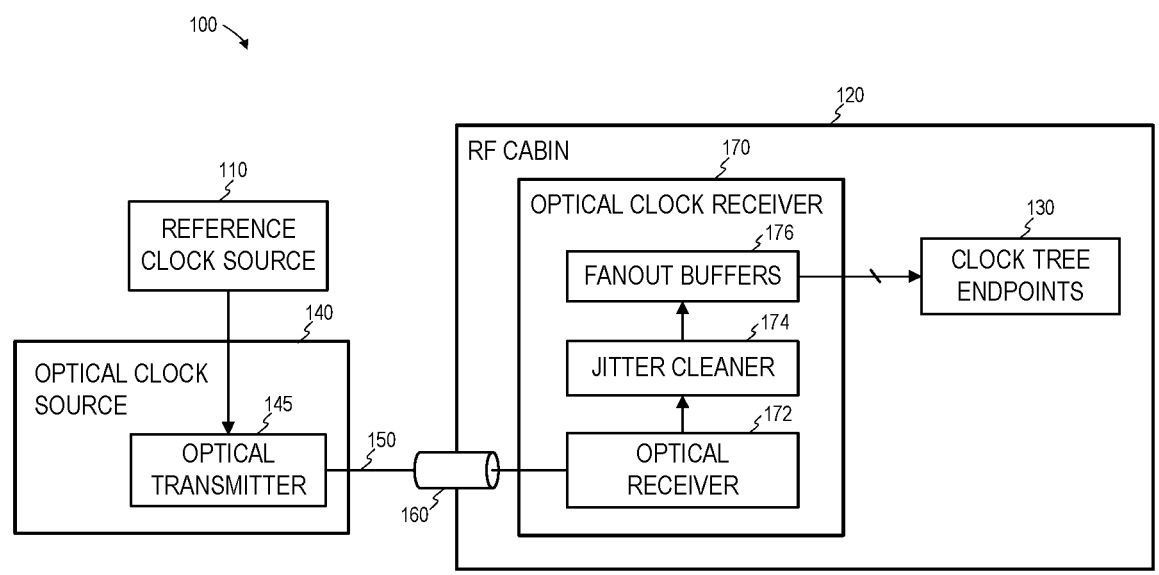
FIG. 1 is a block diagram of a system to transmit a clock signal via an optical path and process the clock signal using a jitter cleaner having an on-chip oscillator according to some embodiments.

FIG. 1 is a block diagram of system 100 according to some embodiments. System 100 is intended to depict a generic implementation of some embodiments, while more detailed examples are described below. According to system 100, a clock signal based on reference clock source 110 is transmitted via an optical path into RF cabin 120 for distribution to clock tree endpoints 130.

Reference clock source 110 may comprise any clock source suitable for its intended use. Reference clock source 110 may output an RF sine wave, a digital signal, or a signal complying with any other well-defined electrical format which is suitable for conveying a clock signal. As will be described in detail below, reference clock source may comprise a reference clock source which serves as the root of a clock tree used within an MR imaging system.

Optical clock source 140 of system 100 receives the clock signal from reference clock source 110 and includes optical transmitter 145. Optical transmitter 145 converts the received clock signal into light pulses which will be referred to herein as an optical clock signal. Optical transmitter 145 injects the light pulses into optical media 150, which may comprise plastic, glass, or any optically-coupled media which provides galvanic isolation between optical transmitter 145 and optical receiver 172. In some embodiments, characteristics of optical transmitter 145 and optical media 150 are matched and selected based on a desired frequency range and required transmission distance.

Waveguide 160 passes through an outer wall, or bulkhead, of RF cabin 120. Waveguide 160 may prevent RF signals from entering or exiting RF cabin 120 but allows non-conductive media such as optical media 150 to pass through the RF barrier without additional connectors or filtering. Waveguide 160 may comprise a conductive metal tube, where a diameter of the tube determines wavelengths which are allowed to pass therethrough. The diameter may therefore be calculated (e.g., ⅓ to ¼ of tube length) so as to prevent passage of RF frequencies into or out of waveguide 160. Use of a waveguide and optical media as described is therefore particularly beneficial for implementations in which components disposed within RF cabin 120 might be adversely affected by certain frequencies during operation.

Optical clock receiver 170 is disposed within RF cabin 120. Optical clock receiver 170 includes optical receiver 172 to which optical media 150 is coupled. The characteristics of optical receiver 172 are matched to optical media 150 and selected based on a desired frequency range and required optical power sensitivity. Optical receiver 172 receives the optical clock signal from optical transmitter 145 and translates the light pulses thereof into an electrical clock signal having common electrical signal levels (e.g., CMOS, LVDS). The optical clock signal carried by optical media 150 and received by optical receiver 172 is a dedicated (baseband) signal without a data component according to some embodiments, which may advantageously reduce operating requirements of the optical components.

Optical receiver 172 provides the electrical clock signal to jitter cleaner 174 of optical clock receiver 170. The provided signal may exhibit unsuitable jitter due to the operation and temperature and voltage dependencies of optical transmitter 145 and optical receiver 172. According to some embodiments, jitter cleaner 174 outputs a low-jitter clock signal based on the signal received from optical receiver 172. The output low-jitter clock signal has a frequency equal to the average frequency of the signal received from optical receiver 172, while the jitter of the output low-jitter clock signal is the jitter of a low-jitter local oscillator of jitter cleaner 174. According to the illustrated embodiment, the local oscillator is a resonant cavity located in the silicon of jitter cleaner 174.

In addition to the above-mentioned components which may be susceptible to certain frequencies, RF cabin 120 may include other unshown components which may generate a harsh magnetic environment within RF cabin during operation. In some embodiments, oscillation of the resonant cavity of jitter cleaner 174 is substantially immune to high static magnetic fields and severe magnetic field gradients. Accordingly, jitter cleaner 174 may advantageously operate to output a low-jitter clock signal based on a signal received from optical receiver 172 even in the presence of harsh magnetic conditions within RF cabin 120.

Low-jitter fanout buffers 176 of optical clock receiver 170 replicate the output of jitter cleaner 174 and provide a dedicated, buffered path to each of endpoints 130 of a downstream clock tree. Use of fanout buffers 176 may improve signal integrity and the resulting performance of each of endpoints 130. Depending on the downstream endpoints 130, fanout buffers 176 may use CMOS, LVDS or other industry-standard signal levels and topologies. Endpoints 130 may include, but are not limited to, processors, FPGAs, TDCs, ADCs, DACs, sample-and-hold buffers, and custom ASICs.

Each of the illustrated elements of system 100 may be implemented using any suitable combination of hardware and software that is or becomes known. Implementations of system 100 include elements in addition to those illustrated in FIG. 1.

Figure 2:
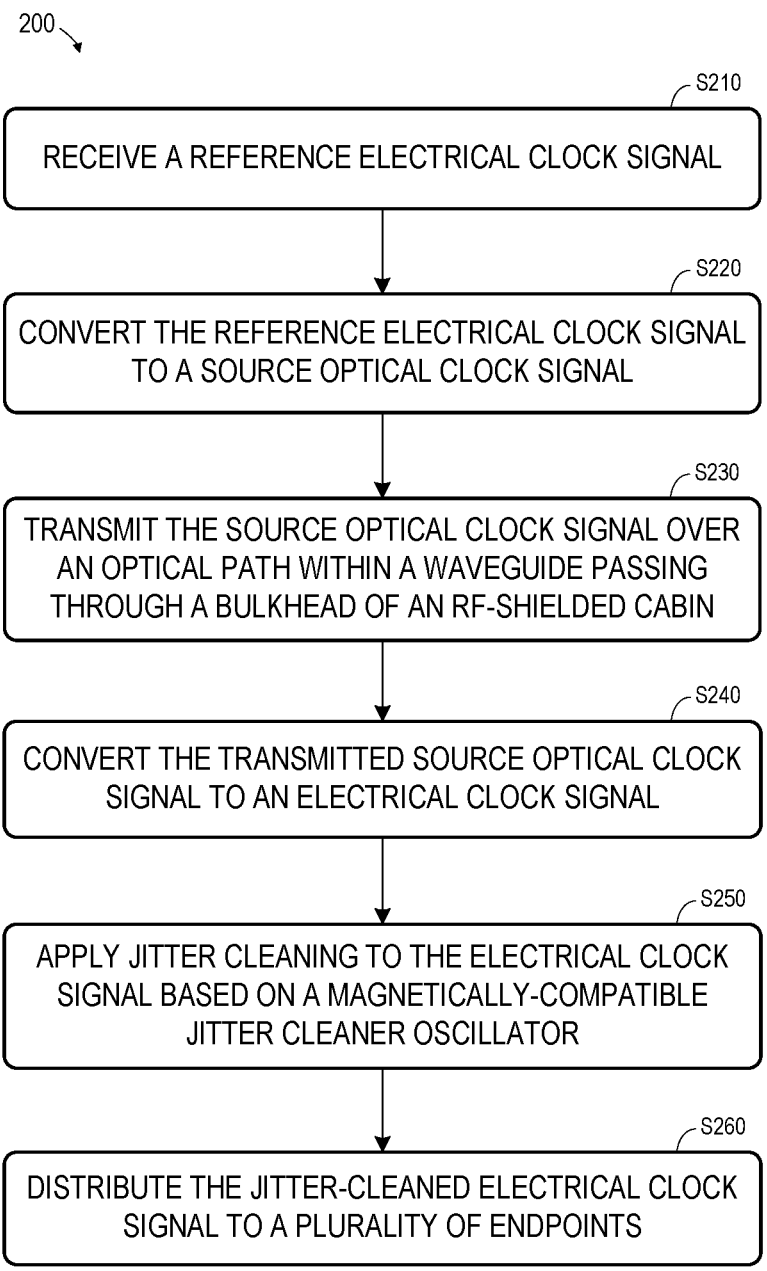
FIG. 2 is a flow diagram of a process to transmit a clock signal via an optical path and process the clock signal using a jitter cleaner according to some embodiments.

FIG. 2 is a flow diagram of process 200 to transmit a clock signal via an optical path and process the clock signal using a jitter cleaner according to some embodiments. Process 200 may be executed by system 100 in some embodiments. Steps of process 200 may be performed by hardware and/or a processing unit executing program code. Such program code may be stored by any non-transitory tangible medium, including a fixed disk, a volatile or non-volatile random-access memory, a DVD, a Flash drive, and a magnetic tape, and executed by any suitable processing unit, including but not limited to one or more microprocessors, microcontrollers, processing cores, and processor threads. Embodiments are not limited to the examples described below.

Initially, a reference electrical clock signal is received at S210. The reference electrical clock signal may comprise an RF sine wave, a digital signal, or any other suitable electrical clock signal. The reference electrical clock signal may be received from a reference clock source which is used in a system separate from the system to which a reference clock signal will be provided via process 200.

The received reference electrical clock signal is converted to a source optical clock signal at S220. An optical transmitter may be employed at S220 to convert the reference electrical clock signal into light pulses as is known in the art. Next, at S230, the source optical clock signal is transmitted over an optical path to an optical receiver. As described above, the optical path may comprise optical media disposed within a waveguide passing through a bulkhead of an RF-shielded cabin. Such an optical path provides galvanic isolation between the optical transmitter and the optical receiver, while the waveguide may prevent RF signals from entering or exiting the RF cabin.

The optical receiver receives the transmitted source optical clock signal and converts the source optical clock signal into an electrical clock signal at S240. Next, at S250, a jitter cleaner applies jitter cleaning to the electrical clock signal based on a magnetically-compatible jitter cleaner oscillator. In this regard, the jitter cleaner operates to steer its own oscillator's frequency based on an average frequency of the input electrical clock signal, so that the jitter-cleaned electrical clock signal exhibits the average frequency of the input electrical clock signal and the jitter of the jitter cleaner oscillator. Magnetic compatibility refers to a characteristic by which the jitter of the jitter cleaner oscillator, and therefore of the jitter-cleaned electrical clock signal, remains suitably low for its intended purpose even in the presence of high static magnetic fields and/or severe magnetic field gradients.

The jitter-cleaned clock signal is distributed to a plurality of endpoints at S260. As described above, low-jitter fanout buffers may replicate the jitter-cleaned clock signal output from the jitter cleaner and provide a dedicated, buffered path to each of endpoint of a downstream clock tree.

Figure 3:
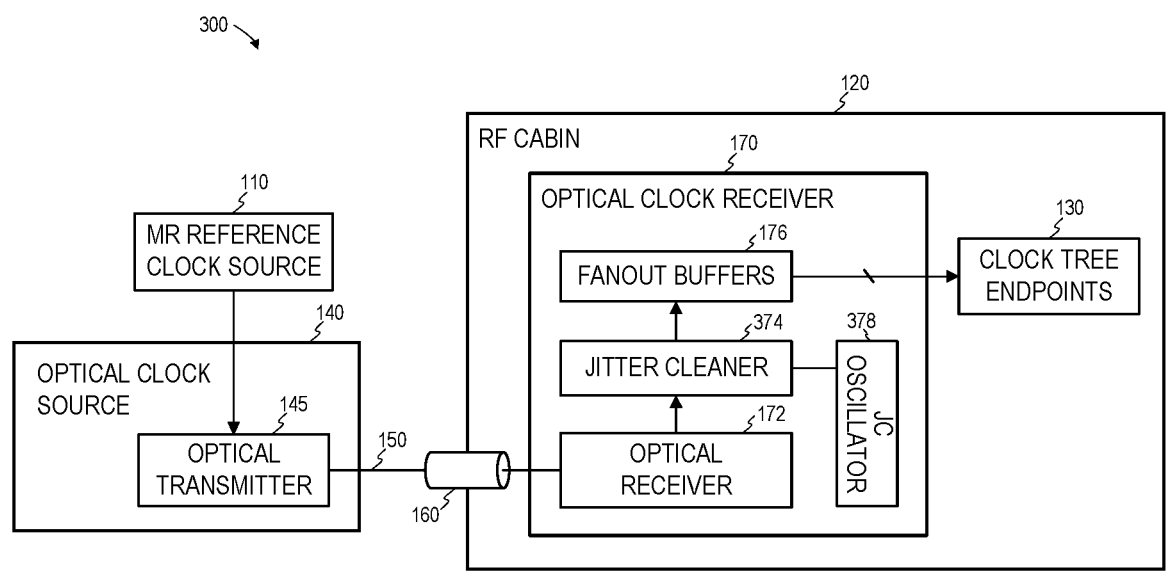
FIG. 3 is a block diagram of a system to transmit a clock signal via an optical path and process the clock signal using a jitter cleaner having an off-chip oscillator according to some embodiments.

FIG. 3 is a block diagram of system 300 to transmit a clock signal via an optical path and process the clock signal using a jitter cleaner having an off-chip oscillator according to some embodiments. System 300 may operate to perform process 200 as described above.

The elements of system 300 are identical to those of system 100 with the exception of jitter cleaner 374 and jitter cleaner oscillator 378. In contrast to jitter cleaner 174 of system 100, in which the low-jitter and magnetically-compatible jitter cleaner oscillator is a resonant cavity located in the silicon of jitter cleaner 174, jitter cleaner 374 operates in conjunction with off-chip low-jitter and magnetically-compatible jitter cleaner oscillator 378.

As described above, jitter cleaner 374 operates to steer a frequency of jitter cleaner oscillator 378 based on an average frequency of an input electrical clock signal, to output a jitter-cleaned electrical clock signal exhibiting the average frequency of the input electrical clock signal and the jitter of jitter cleaner oscillator 378. In the illustrated embodiment, the jitter of jitter cleaner oscillator 378, and therefore of the jitter-cleaned electrical clock signal output from jitter cleaner 374, remains suitably low for its intended purpose even in the presence of high static magnetic fields and/or severe magnetic field gradients.

Figure 4:
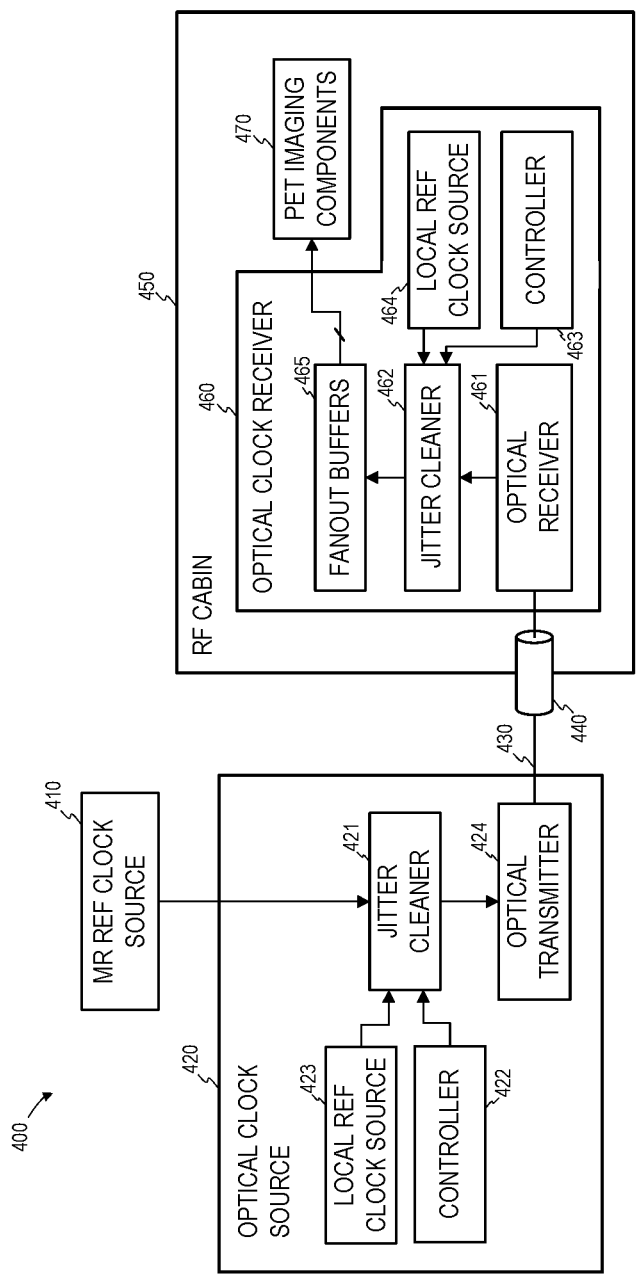
FIG. 4 is a block diagram of a system to generate a clock signal using a jitter cleaner, transmit the clock signal via an optical path and process the transmitted clock signal using a jitter cleaner according to some embodiments.

FIG. 4 is a block diagram of system 400 to generate a clock signal using a jitter cleaner, transmit the clock signal via an optical path, and process the transmitted clock signal using a jitter cleaner according to some embodiment. System 400 is also depicted as operating in conjunction with an MR imaging system and a PET imaging system, although embodiments are not limited thereto.

MR reference clock source 410 provides a clock signal to optical clock source 420. MR reference clock source 410 may be used to control RF-based imaging of an MR imaging system (not shown). According to some embodiments, the clock signal output from MR reference clock source 410 will be advantageously used as a basis for clock signals provided to PET imaging system components.

For example, depending on the magnetic fields employed, an MR system may form images using Fourier transforms in the 120-130 MHz range. This spectrum should remain free of other activity during imaging to avoid image distortion. It is therefore imperative that PET imaging system components located in the RF cabin of the MR imaging system do not switch at frequencies within the spectrum. By locking the PET imaging components to the same MR reference clock source 410 (e.g., 10 Mhz) as used in the MR imaging system, it can be assured that the PET imaging system operation does not drift into the MR imaging spectrum or exhibit an unpredictable frequency harmonic.

Jitter cleaner 421 is used to reduce the jitter of the electrical clock signal output from MR reference clock source 410 as is known in the art. Use of jitter cleaner 421 allows provision of a potentially-cleaner signal to optical transmitter 424 than that provided to optical transmitter 145 of systems 100 and 300. Jitter cleaner 421 may operate as described above to steer a frequency of its internal jitter cleaner oscillator based on an average frequency of the electrical clock signal received from source 410, and to output a jitter-cleaned electrical clock signal exhibiting the average frequency of the received electrical clock signal and the jitter of its internal jitter cleaner oscillator. Jitter cleaner 421 may employ an off-chip jitter cleaner oscillator in some embodiments as described above with respect to system 300.

The jitter cleaner oscillator of jitter cleaner 421 need not be magnetically-compatible in some embodiments, particularly in a case that optical clock source 420 is not located in a magnetically-harsh environment. As shown in FIG. 4, optical clock source 420 is located outside of RF cabin 450 and therefore might not be subject to high magnetic fields and/or gradients, reducing the need for the jitter cleaner oscillator of jitter cleaner 421 to be magnetically-compatible.

Jitter cleaner 421 according to some embodiments may selectively accept one of two reference clock signals. Optical clock source 420 therefore includes local reference clock source 423 for providing a second reference clock signal to jitter cleaner 421. Jitter cleaner 421 may be configured to consider one source (e.g., source 410) as a preferred source and the other source (e.g., source 423) as a failover source. When a failover mode is enabled, jitter cleaner 421 initially attempts to receive input from source 410 and switches over to source 423 if the clock signal from source 410 is lost or otherwise deemed faulty by jitter cleaner 421. The presence of local reference clock source 423 also allows free-standing operation of optical clock source 420 (e.g., in a PET/CT system where no external reference frequency is required). Local reference clock source 423 may be implemented using a resonant crystal, voltage-controlled crystal oscillator (VCXO), temperature-controlled crystal oscillator TCXO, silicon oscillator, or other similar device.

Controller 422 may be used to configure settings of jitter cleaner 421, including but not limited to failover mode, holdover mode (described below), output format, output frequency (as a function of the average frequency of the input clock signal), etc. Controller 422 may be implemented by a Peripheral Interface Controller, Arduino, or ARM-based microcontroller. Alternatively, controller 422 may be instantiated as a soft-core controller or state machine inside an FPGA.

Optical transmitter 424 receives the jitter-cleaned electrical reference clock signal from jitter cleaner 421 and converts the clock signal into an optical clock signal. Optical transmitter 424 injects the optical clock signal into optical media 430, which passes through waveguide 440 (and RF cabin 450) to optical receiver 461 of optical clock receiver 460. Optical media 430 and waveguide 440 may operate as described above to prevent passage of RF frequencies into or out of RF cabin 450 without additional connectors or filtering.

Optical receiver 461 converts the optical clock signal into an electrical clock signal and provides the electrical clock signal to jitter cleaner 462. Jitter cleaner 462 may operate as described above to steer a frequency of its internal jitter cleaner oscillator (i.e., on-chip resonant cavity) based on an average frequency of the electrical clock signal received from optical receiver 461 and to output a jitter-cleaned electrical clock signal exhibiting the average frequency of the received electrical clock signal and the jitter of its internal jitter cleaner oscillator. As also described above, jitter cleaner 462 may employ an off-chip jitter cleaner oscillator in some embodiments.

Optical clock receiver 460 also includes local reference clock source 464 for providing a second selectable reference clock signal to jitter cleaner 462 as described above. Controller 463 may be used to configure settings of jitter cleaner 462 and may be implemented as described above with respect to controller 422. Low-jitter fanout buffers 465 of optical clock receiver 460 replicate the jitter-cleaned electrical clock signal output by jitter cleaner 462 and provide a dedicated, buffered path to each of PET imaging components 470 of a downstream clock tree. PET imaging components 470 may include the above-mentioned clock tree endpoints, which may comprise components of DEAs.

PET/MR imaging systems acquire MR and PET images via simultaneous MR and PET scans. The MR scan may subject PET imaging components 470 and other components within RF cabin 120 to high magnitude magnetic fields and severe magnetic field gradients during the PET scan. Advantageously, oscillation of the resonant cavity of jitter cleaner 462 may be substantially immune to such environmental conditions, allowing jitter cleaner 462 to output a low-jitter clock signal required for TOF PET imaging even during execution of an MR scan.

Figure 5:
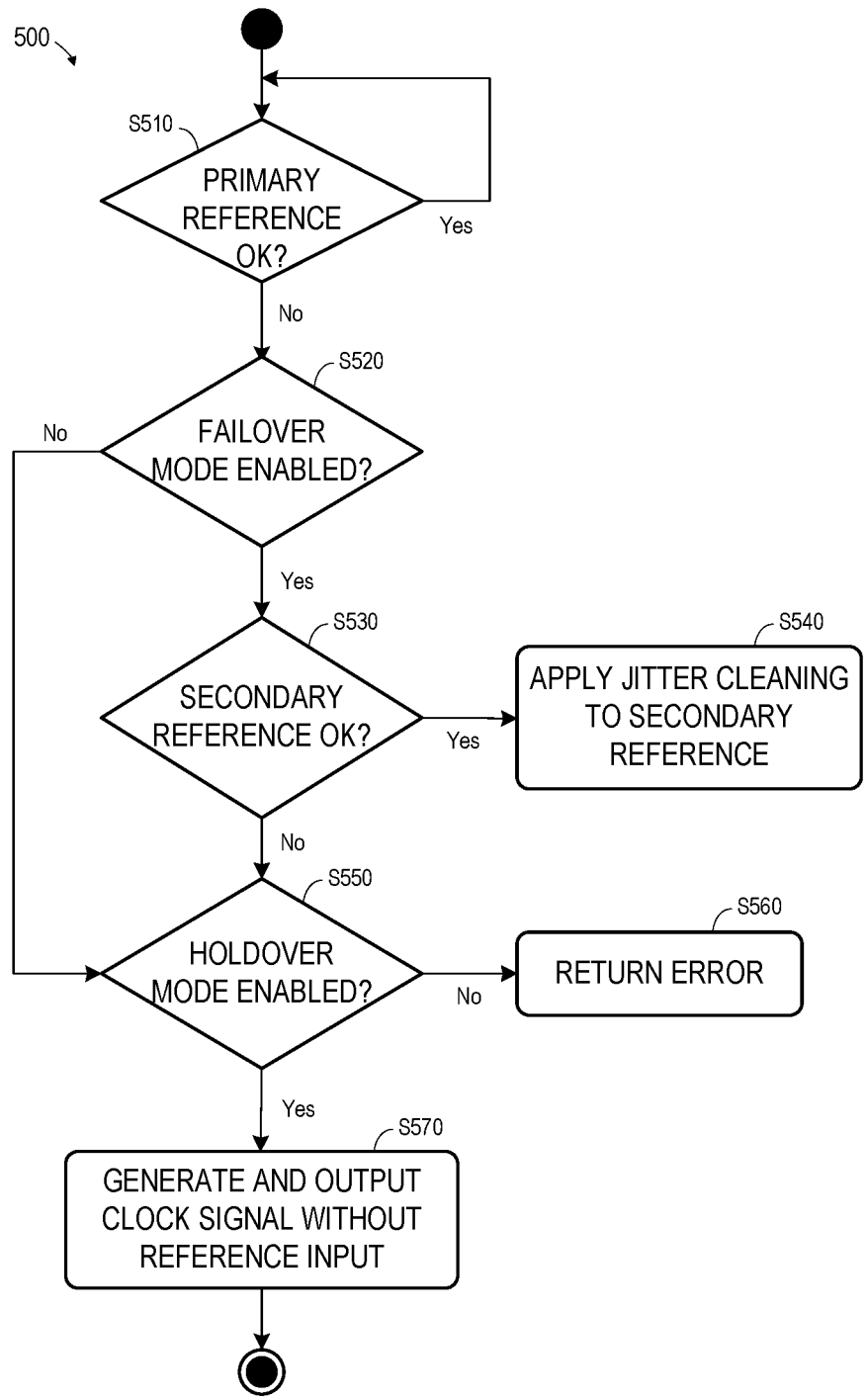
FIG. 5 is a flow diagram of a process for a jitter cleaner to execute a holdover mode and/or a failover mode in response to a lost or invalid input reference clock signal according to some embodiments.

FIG. 5 is a flow diagram of process 500 for a jitter cleaner to execute a holdover mode and/or a failover mode in response to a lost or invalid input reference clock signal according to some embodiments. Process 500 may be executed by a jitter cleaner disposed in an optical clock source or in an optical clock receiver as described herein.

As described above, according to some embodiments, a controller may configure a jitter cleaner to enable neither, one or both of a failover mode and a holdover mode. Generally, a failover mode may allow a jitter cleaner to switch to a secondary input signal source in response to an error in a primary input signal source. A holdover mode allows a jitter cleaner to continue outputting a jitter-cleaned signal even if an initially-present clock source is disabled. In holdover mode, the resonant cavity of the jitter cleaner continues to resonate based on the average frequency of the initially-present clock source, and its output clock signal will drift slowly over time due to narrow bandwidth of the jitter cleaner.

Process 500 assumes that a jitter cleaner has been configured to operate with respect to a specified primary reference signal source, such as MR reference clock source 410, and such operation has commenced. A controller may configure the jitter cleaner, which also includes specifying a frequency of a clock signal to output (e.g., specified as a multiple or fraction of the average frequency of the input signal). As described above, the controller may configure the jitter cleaner to enable neither, one or both of a failover mode and a holdover mode.

At S510, it is determined whether the primary reference signal meets configured acceptance parameters of the jitter cleaner. Flow therefore cycles at S510 while the jitter cleaner outputs a jitter-cleaned signal based on the primary reference signal, until it is determined at S510 that the primary reference signal does not meet the configured acceptance parameters. For example, an MR reference clock source may be interrupted or otherwise affected by shifts in electrical environment caused by gradient pulses generated during an MR scan, resulting in a negative determination at S510.

Flow proceeds to S520 if the primary reference signal does not meet the configured acceptance parameters of the jitter cleaner. At S520, it is determined whether a failover mode is enabled and, if so, flow proceeds to S530 to determine whether a signal output from a secondary reference signal source of the jitter cleaner meets the acceptance parameters. If so, the jitter cleaner applies jitter cleaning to the signal output from the secondary reference signal source at S540. Although not represented in FIG. 5, the jitter cleaner may switch back to the primary reference signal source if the primary reference signal source is determined to have recovered from the prior error.

If failover mode is not enabled, or if it is determined at S530 that the secondary reference does not meet the acceptance parameters, flow proceeds to S550 to determine whether holdover mode is enabled. If not, an error is returned at S560 and the jitter cleaner ceases to outputs a signal. If holdover mode is enabled, the jitter cleaner generates and outputs a low-jitter clock signal at S570 without using an incoming reference signal. As described above, the resonant cavity of the jitter cleaner continues to resonate based on the average frequency of the previously-present clock source, and its output clock signal will drift slowly over time. In some embodiments, the jitter cleaner may eventually resume use of the primary reference signal source (or the secondary reference signal source) if the primary reference signal source (or the secondary reference signal source) is determined to have recovered from the prior error.

Process 500 simply describes one example of a control algorithm for a jitter cleaner providing a failover mode and a holdover mode. Embodiments are not limited to the particular logic of process 500.

Figure 6:
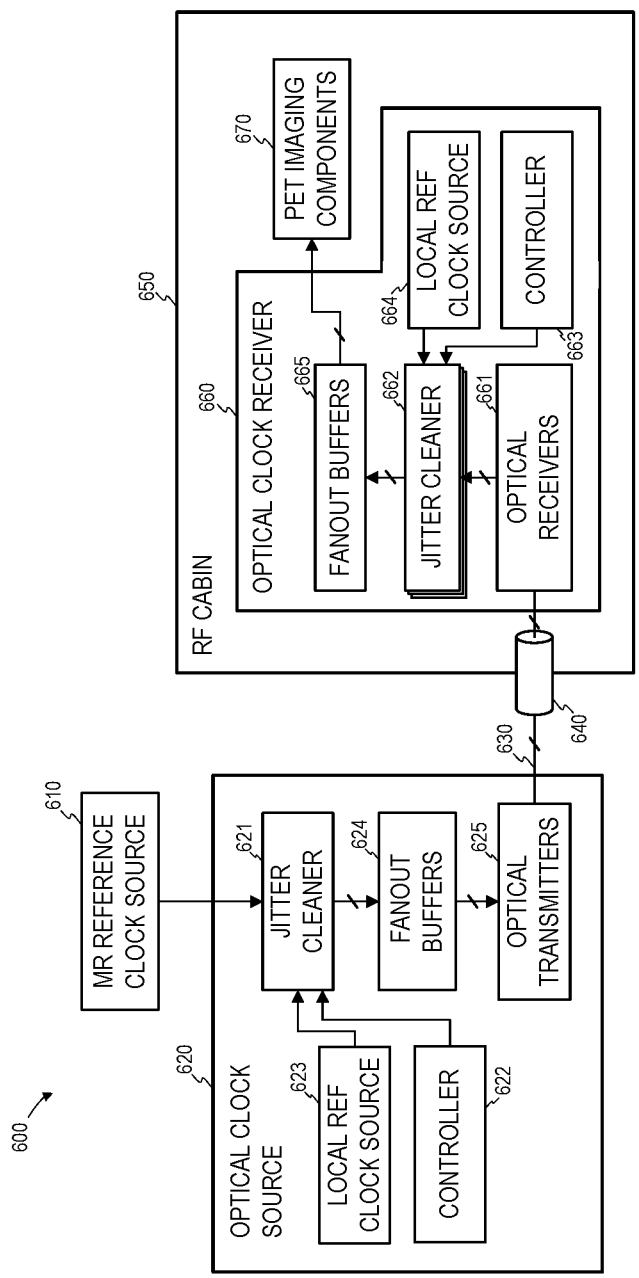
FIG. 6 is a block diagram of a system to generate a clock signal using a jitter cleaner, transmit the clock signal via a plurality of optical paths and process the transmitted clock signals using a plurality of jitter cleaners according to some embodiments.

FIG. 6 is a block diagram of system 600 to generate a clock signal using a jitter cleaner, transmit the clock signal via a plurality of optical paths and process the transmitted clock signals using a plurality of jitter cleaners according to some embodiments.

Jitter cleaner 621, controller 622 and local reference clock source 623 of optical clock source 620 may be implemented as described above with respect to jitter cleaner 421, controller 422 and local reference clock source 423 of optical clock source 420. Jitter cleaner 621 may provide a number of outputs which carry a low-jitter clock signal based on a signal received from MR reference clock source 610. In one example, jitter cleaner 621 provides eight outputs. Fanout buffers 624 are used to drive the eight outputs to a greater number of (e.g., thirty) outputs. These thirty outputs are coupled to respective ones of thirty optical transmitters 625. Embodiments are not limited to the eight/thirty example described above.

Each of the thirty optical transmitters 625 are coupled to a respective one of thirty optical receivers 661 via a dedicated optical media 630. The thirty optical media 630 pass though waveguide 640 of RF cabin 650 as described above.

Each optical receiver 661 provides its output signal to a respective one of jitter cleaners 662, which operate as described above to provide their output to fanout buffers 665. Fanout buffers 665 may increase the number of outputs or simply drive each of the thirty outputs to respective ones of PET imaging components 670. In some embodiments, PET imaging components 670 include thirty DEAs, each of which is provided with a respective clock signal by fanout buffers 665. Each DEA may in turn include a number (e.g., ten) PET detectors, each of which operates based on the clock provided to its respective DEA.

The fan-out architecture of embodiments is not limited to FIG. 6. In alternative embodiments, a single clock signal may be transmitted to optical clock receiver 660, with a single jitter-cleaner 662 jitter-cleaning this clock signal and outputting the clock signal on multiple outputs. The multiple outputs may then be fanned out to a greater number of outputs by fanout buffers 665 of optical clock receiver 660.

Each of the above-discussed embodiments may be employed to create and distribute a jitter-cleaned sync signal, independently of or in conjunction with creation and distribution of a jitter-cleaned clock signal. For example, some embodiments may include a first optical clock source and associated first optical clock receiver located within an RF cabin for generating and distributing a clock signal based on a reference clock source and a second optical clock source and associated second optical clock receiver located within an RF cabin for generating and distributing a sync signal based on the same reference clock source.

Figure 7:
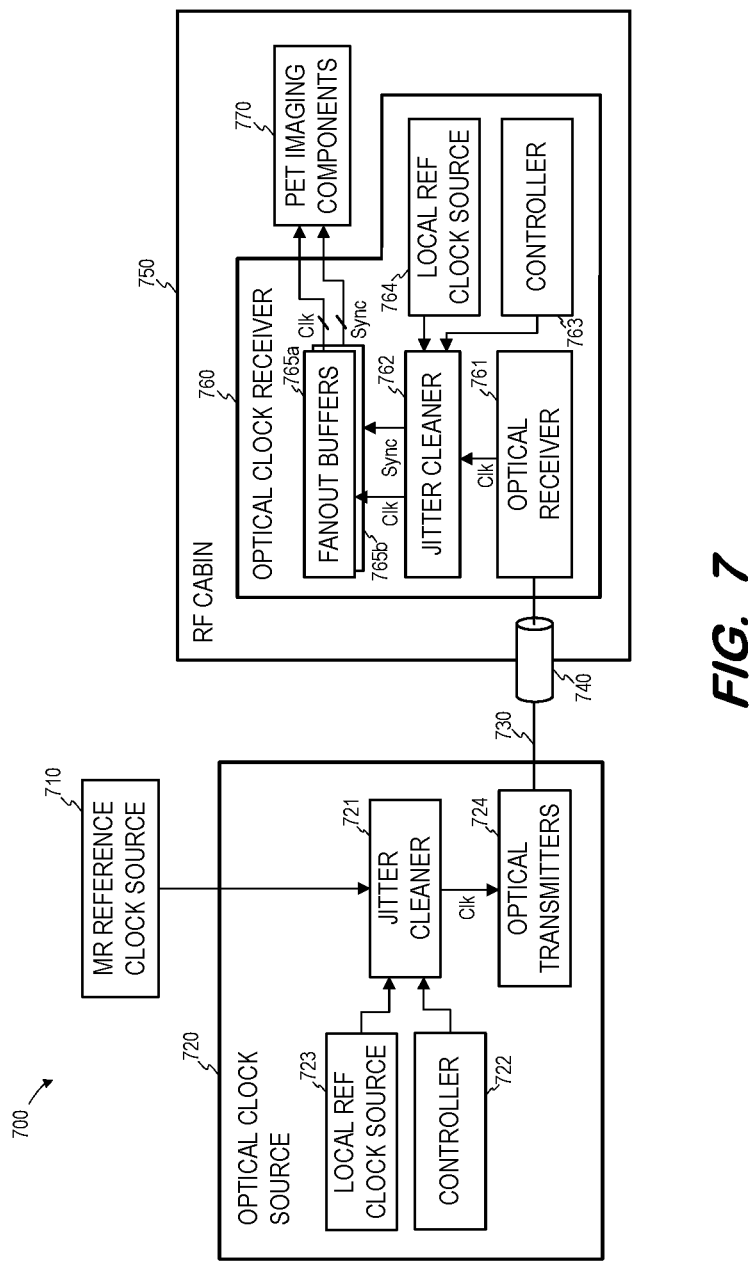
FIG. 7 is a block diagram of a system to generate a clock signal using a jitter cleaner, transmit the clock signal via an optical path, and use a jitter cleaner to generate jitter-cleaned clock and sync signals based on the transmitted clock signal according to some embodiments.

System 700 of FIG. 7 illustrates an alternative in which a clock signal is generated using a jitter cleaner, the clock signal is transmitted into an RF cabin via an optical path, and a jitter cleaner is used to generate jitter-cleaned clock and sync signals based on the transmitted clock signal. Optical clock source 720 may operate to generate and transmit an optical clock signal as described above with respect to optical clock source 420 of FIG. 4, but embodiments are not limited thereto. Optical receiver 761 of optical clock receiver 760 converts the optical clock signal to an electrical clock signal and provides the electrical clock signal to jitter cleaner 762.

In the illustrated embodiment, controller 763 configures jitter cleaner 762 to output a low-jitter clock signal (e.g., 10 MHz) on at least one output signal line of jitter cleaner 762 and to output a low-jitter sync signal (e.g., 1 MHz) on at least one output signal line of jitter cleaner 762. Jitter cleaner 762 may generate the low-jitter sync signal based on a local magnetically-compatible oscillator as described above with respect to generation of a low-jitter clock signal.

The low-jitter clock signal is input to fanout buffers 765a and the low-jitter sync signal is input to fanout buffers 765b. Fanout buffers 765a and 765b then provide the clock and sync signals to appropriate downstream PET imaging components 770.

Figure 8:
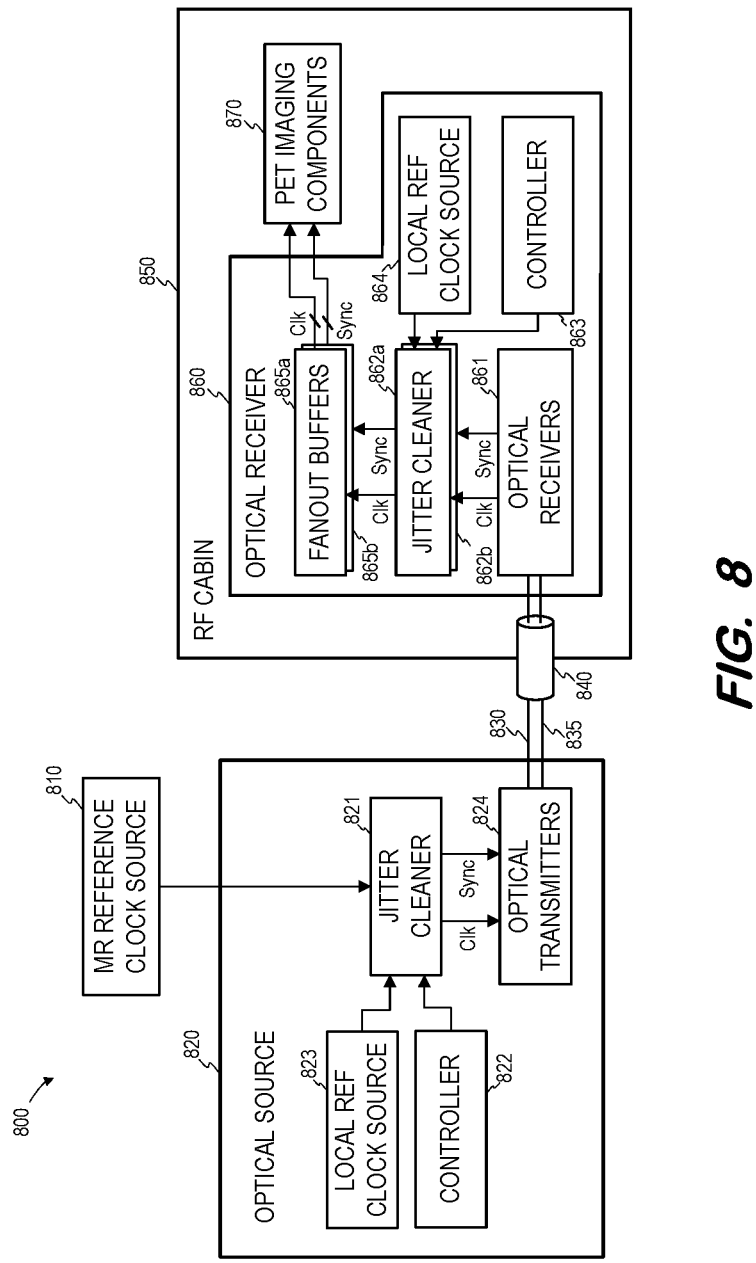
FIG. 8 is a block diagram of a system to generate a clock signal and a sync signal using a jitter cleaner, transmit the clock signal and the sync signal via optical paths, and use jitter cleaners to generate jitter-cleaned clock and sync signals based on the transmitted clock signal and sync signal according to some embodiments.

System 800 of FIG. 8 illustrates another alternative in which a clock signal and a sync signal are generated using a jitter cleaner, the clock signal and the sync signal are transmitted into an RF cabin via optical paths, and dedicated jitter cleaners are used to generate jitter-cleaned clock and sync signals based on the transmitted clock signal and sync signal.

Jitter cleaner 821 of optical source 820 is configured (e.g., via controller 822) to output a low-jitter clock signal on at least one output signal line and to output a low-jitter sync signal on at least one other output signal line based on MR reference clock source 810. Specifically, jitter cleaner 821 steers a frequency of its (on-chip or off-chip) jitter cleaner oscillator based on an average frequency of the electrical clock signal received from MR reference clock source 810 and outputs a jitter-cleaned electrical clock signal exhibiting the average frequency of the received electrical clock signal and the jitter of the jitter cleaner oscillator and a jitter-cleaned electrical sync signal exhibiting a fraction of the average frequency of the received electrical clock signal and the jitter of the jitter cleaner oscillator.

Optical transmitters 824 receive the clock and sync signals, convert the clock and sync signals to corresponding optical signals, and transmit the corresponding optical signals over dedicated optical media 830 and 835 through waveguide 840 to optical receivers 861 of optical receiver 860. Some embodiments may employ fanout buffers to increase the number of clock and/or sync signals provided to optical transmitters 824, which would in such a case include a transmitter for each signal coupled to a dedicated optical media as described above.

Optical receivers 861 converts the optical clock signal and the optical sync signal to corresponding electrical signals and provides the electrical signals to respective jitter cleaners 862a and 862b. Jitter cleaners 862a and 862b then operate as described herein to output a low-jitter signal based on the average frequency of their respective input signals. In this regard, jitter cleaner 862a outputs a low-jitter clock signal to fanout buffers 865a and jitter cleaner 862b outputs a low-jitter sync signal to fanout buffers 865b. Fanout buffers 865a and 865b provide the received clock and sync signals to downstream PET imaging components 870.

Figure 9:
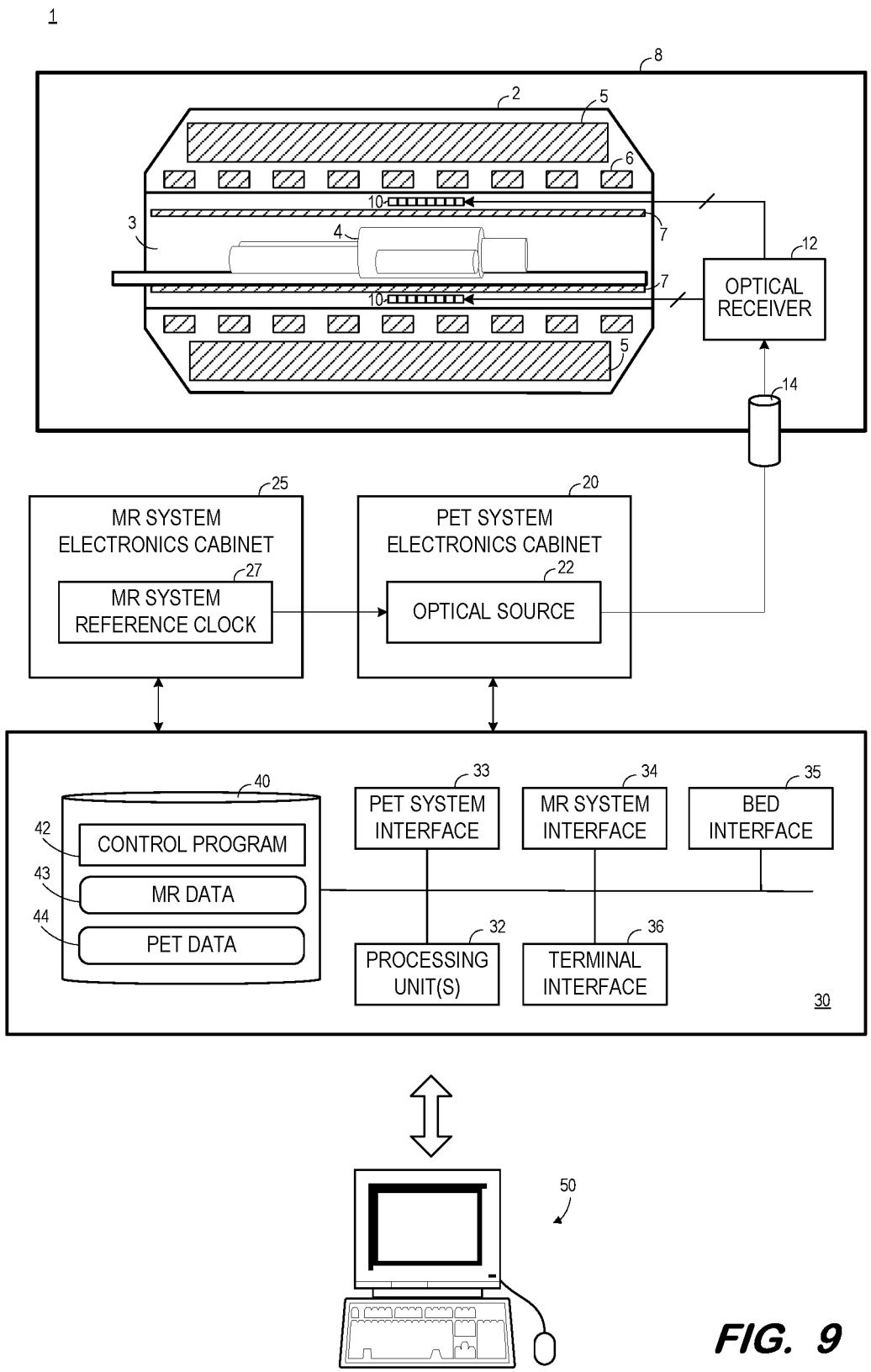
FIG. 9 is a block diagram of a PET-MR imaging system according to some embodiments.

FIG. 9 is a block diagram of a PET-MR imaging system for executing MR and PET scans according to some embodiments. System 1 includes MR chassis 2 disposed within RF cabin 8. MR chassis 2 defines bore 3 in which patient 4 is disposed. MR chassis 2 includes polarizing main magnet 5, gradient coils 6 and RF coil 7 arranged about bore 3. According to some embodiments, polarizing main magnet 5 generates a uniform main magnetic field ($F_0$), RF coil 7 emits an excitation field ($F_1$) and gradient coils 6 produce magnetic field gradients $F_x$, $F_y$, and $F_z$.

PET detectors 10 comprise a ring of PET detectors disposed between gradient coils 6 and RF coil 7, but embodiments are not limited thereto. PET detectors 10 may acquire PET data during a PET scan based on clock and/or sync signals provided by optical receiver 12, which may be implemented as described herein. Such a PET scan may be performed contemporaneously with an MR scan, which may subject the components of optical receiver 12 to high static magnetic fields and/or sever magnetic gradients.

Optical receiver 12 receives one or more optical timing signals from optical source 22 via waveguide 14 disposed at a boundary of RF cabin 8. One or more optical receivers 12 circuits may be used, depending on the desired partitioning of PET detectors 10. Waveguide 14 allows passage of optical signals while preventing certain RF wavelengths from passing through the boundary.

Optical source 22 of PET system electronics cabinet 20 may be implemented as described herein to generate one or more clock and/or sync signals based on MR system reference clock 27 of MR system electronics cabinet 25. Both MR system electronics cabinet 25 and PET system electronics cabinet 20 also include other unshown components.

All clocks used to perform timing, energy, and position measurements of PET events may therefore be directly traceable, with fixed frequency and phase relationships, to MR system reference clock 27. MR system reference clock 27 may also be a root of a clock tree used for operation of MR-related components of MR chassis 2. Accordingly, all clocks running within the combined PET/MR system have repeatable, deterministic, and stable relationships to each other.

System 30 may comprise any general-purpose or dedicated computing system. Accordingly, system 30 includes one or more processing units 32 (e.g., processors, processor cores, execution threads, etc.) configured to execute processor-executable program code to cause system 30 to operate as described herein, and storage device 40 for storing the program code. Storage device 40 may comprise one or more fixed disks, solid-state random-access memory, and/or removable media (e.g., a thumb drive) mounted in a corresponding interface (e.g., a USB port).

Storage device 40 stores program code of control program 42. One or more processing units 32 may execute control program 42 to provide instructions to MR system electronics cabinet 25 via MR system interface 34. For example, MR system electronics cabinet 25 may be instructed to initiate a desired pulse sequence, to control the switching of magnetic field gradients at appropriate times, to transmit radio-frequency pulses having a specified phase and amplitude at specified times, and to readout resulting MR signals to generate MR data 43.

One or more processing units 32 may execute control program 42 to, in conjunction with PET system interface 33 and bed interface 35, control hardware elements to move the patient past PET detectors 10 and detect annihilation events occurring within the patient. The detected events may be stored in memory 40 as PET data 44, which may comprise list-mode data and/or sinograms. Detection of the events may comprise determination of detection times based on clock and sync signals provided by optical receiver 12.

PET images, MR images and combined images may be provided to terminal 50 via terminal interface 36 of system 30. Terminal interface 36 may also receive input from terminal 50, which may be used to provide commands to control program 42 in order to control elements of system 1. The commands may include commands to initiate an imaging sequence to acquire image data of a subject. Terminal 50 may simply comprise a display device and an input device coupled to system 30. In some embodiments, terminal 50 is a separate computing device such as, but not limited to, a desktop computer, a laptop computer, a tablet computer, and a smartphone.

Each component of system 1 and other systems described herein may include other elements which are necessary for the operation thereof, as well as additional elements for providing functions other than those described herein. Each functional component described herein may be implemented in computer hardware, in program code and/or in one or more computing systems executing such program code as is known in the art. Such a computing system may include one or more processing units which execute processor-executable program code stored in a memory system.

Those in the art will appreciate that various adaptations and modifications of the above-described embodiments can be configured without departing from the claims. Therefore, it is to be understood that the claims may be practiced other than as specifically described herein.

What is claimed is:

1. A system comprising:
a radiofrequency-shielded cabin;
a reference clock source disposed outside of the radiofrequency-shielded cabin to output a reference electrical clock signal;
an optical transmitter disposed outside of the radiofrequency-shielded cabin to generate a source optical signal based on the reference electrical clock signal;
an optical medium optically-coupled to the optical transmitter to receive the source optical signal;
an optical receiver optically-coupled to the optical medium disposed within the radiofrequency-shielded cabin to receive the source optical signal and to generate an electrical clock signal based on the source optical signal;
a jitter cleaner disposed within the radiofrequency-shielded cabin to receive the electrical clock signal and to generate a jitter-cleaned electrical clock signal based on an average frequency of the electrical clock signal and a jitter of a magnetically-compatible jitter cleaner oscillator associated with the jitter cleaner, where the jitter cleaner oscillator is a resonant cavity disposed within a semiconductor of the jitter cleaner; and
a plurality of positron emission tomography scanner detectors disposed within the radiofrequency-shielded cabin and to receive the jitter-cleaned electrical clock signal.

2. A system according to claim 1, further comprising:
a waveguide disposed in a boundary of the radiofrequency-shielded cabin,
wherein at least a portion of the optical medium is disposed within the waveguide.

3. A system according to claim 1, wherein the source optical signal is a baseband signal carried by the optical medium.

4. A system according to claim 1, further comprising:
magnetic resonance imaging components disposed within the radiofrequency cabin and to receive the reference electrical clock signal.

5. A system according to claim 1, wherein the jitter cleaner is to generate a jitter-cleaned electrical sync signal based on the average frequency of the electrical clock signal and the jitter of the magnetically-compatible jitter cleaner oscillator associated with the jitter cleaner,
wherein the plurality of positron emission tomography scanner detectors are to receive the jitter-cleaned electrical sync signal.

6. A system according to claim 1, further comprising:
a second jitter cleaner outside the radiofrequency-shielded cabin to receive the reference electrical clock signal and to generate a jitter-cleaned source electrical clock signal based on the average frequency of the reference electrical clock signal and a jitter of a second magnetically-compatible jitter cleaner oscillator associated with the second jitter cleaner,
wherein the optical transmitter is to generate the source optical signal based on the jitter-cleaned source electrical clock signal.

7. A system according to claim 6, wherein the second jitter cleaner is to generate a jitter-cleaned electrical sync signal based on the average frequency of the reference electrical clock signal and the jitter of the second magnetically-compatible jitter cleaner oscillator,
wherein the optical transmitter is to generate a source optical sync signal based on the jitter-cleaned source electrical sync signal,
wherein the optical receiver is to receive the source optical sync signal and to generate an electrical sync signal based on the source optical sync signal,
the system further comprising a third jitter cleaner disposed in the radiofrequency-shielded cabin to receive the electrical sync signal and to generate a jitter-cleaned electrical sync signal based on an average frequency of the electrical sync signal and a jitter of a third magnetically-compatible jitter cleaner oscillator associated with the third jitter cleaner,
wherein the plurality of positron emission tomography scanner detectors are to receive the jitter-cleaned electrical sync signal.

8. A method comprising:
outputting a reference electrical clock signal from a reference clock source disposed outside of a radiofrequency-shielded cabin;
generating a source optical signal outside of the radiofrequency-shielded cabin based on the reference electrical clock signal;
transmitting the source optical signal into the radiofrequency-shielded cabin via optical media;
generating an electrical clock signal based on the source optical signal within the radiofrequency-shielded cabin;
applying jitter cleaning to the electrical clock signal within the radiofrequency-shielded cabin using a jitter cleaner to generate a jitter-cleaned electrical clock signal based on an average frequency of the electrical clock signal and a jitter of a magnetically-compatible jitter cleaner oscillator, where the magnetically-compatible jitter cleaner oscillator is a resonant cavity disposed within a semiconductor of the jitter cleaner; and
transmitting the jitter-cleaned electrical clock signal to a plurality of positron emission tomography scanner detectors disposed within the radiofrequency-shielded cabin.

9. A method according to claim 8, wherein the source optical signal is a baseband signal carried by the optical media.

10. A method according to claim 8, further comprising:
operating a magnetic resonance imaging system disposed within the radiofrequency cabin to acquire an image while applying jitter cleaning to the electrical clock signal.

11. A method according to claim 8, further comprising:
generating a jitter-cleaned electrical sync signal within the radiofrequency cabin based on the average frequency of the electrical clock signal and the jitter of the magnetically-compatible jitter cleaner oscillator; and
transmitting the jitter-cleaned electrical clock signal to the plurality of positron emission tomography scanner detectors.

12. A method according to claim 8, further comprising:
generating a jitter-cleaned source electrical clock signal outside the radiofrequency-shielded cabin based on the average frequency of the reference electrical clock signal and a jitter of a second magnetically-compatible jitter cleaner oscillator,
wherein the source optical signal is generated based on the jitter-cleaned source electrical clock signal.

13. A method according to claim 12, further comprising:
generating a jitter-cleaned electrical sync signal outside the radiofrequency-shielded cabin based on the average frequency of the reference electrical clock signal and the jitter of the second magnetically-compatible jitter cleaner oscillator;
generating a source optical sync signal outside the radiofrequency-shielded cabin based on the jitter-cleaned source electrical sync signal,
generating an electrical sync signal within the radiofrequency-shielded cabin based on the source optical sync signal;
generate a jitter-cleaned electrical sync signal within the radiofrequency-shielded cabin based on an average frequency of the electrical sync signal and a jitter of a third magnetically-compatible jitter cleaner oscillator; and
transmitting the jitter-cleaned electrical sync signal to the plurality of positron emission tomography scanner detectors.

14. A system comprising:
a radiofrequency-shielded cabin;
a reference clock source disposed outside of the radiofrequency-shielded cabin to output a reference electrical clock signal;
an optical system to generate a source optical signal based on the reference electrical clock signal, transmit the source optical signal into the radiofrequency-shielded cabin, and generate an electrical clock signal based on the source optical signal within the radiofrequency-shielded cabin;
a jitter cleaner disposed within the radiofrequency-shielded cabin to receive the electrical clock signal and to generate a jitter-cleaned electrical clock signal based on the electrical clock signal;
a magnetically-compatible jitter cleaner oscillator comprising a resonant cavity disposed within a semiconductor of the jitter cleaner, and
a plurality of positron emission tomography scanner detectors disposed within the radiofrequency-shielded cabin and to receive the jitter-cleaned electrical clock signal.

15. A system according to claim 14, further comprising:
a waveguide disposed in a boundary of the radiofrequency-shielded cabin,
wherein at least a portion of the optical system is disposed within the waveguide.

16. A system according to claim 14, further comprising:
magnetic resonance imaging components disposed within the radiofrequency-shielded cabin and to operate based on the reference electrical clock signal.

17. A system according to claim 14, wherein the jitter cleaner is to generate a jitter-cleaned electrical sync signal based on electrical clock signal,
wherein the plurality of positron emission tomography scanner detectors are to receive the jitter-cleaned electrical sync signal.

18. A system according to claim 14, further comprising:
a second jitter cleaner outside the radiofrequency-shielded cabin to receive the reference electrical clock signal and to generate a jitter-cleaned source electrical clock signal based on the reference electrical clock signal,
wherein the optical system is to generate a source optical sync signal based on the jitter-cleaned source electrical clock signal, transmit the source optical sync signal into the radiofrequency-shielded cabin, and generate an electrical sync signal based on the source optical sync signal within the radiofrequency-shielded cabin,
the system further comprising a third jitter cleaner disposed in the radiofrequency-shielded cabin to receive the electrical sync signal and to generate a jitter-cleaned electrical sync signal based on the electrical sync signal,
wherein the plurality of positron emission tomography scanner detectors are to receive the jitter-cleaned electrical sync signal, and
wherein a jitter of the jitter-cleaned electrical sync signal is substantially unaffected by magnetic fields and magnetic field gradients within the radiofrequency-shielded cabin.

* * * * *